United States Patent [19]

Foreman

[11] Patent Number: 4,467,194

[45] Date of Patent: Aug. 21, 1984

[54] OMNIDIRECTIONAL ELECTRO-OPTICAL RECEIVER

[75] Inventor: Donald S. Foreman, Spring Lake Park, Minn.

[73] Assignee: Honeywell Inc., Minneapolis, Minn.

[21] Appl. No.: 303,435

[22] Filed: Sep. 18, 1981

[51] Int. Cl.³ .............................................. H01J 3/14
[52] U.S. Cl. .................................... 250/216; 350/294
[58] Field of Search ............... 350/294; 250/203, 216; 356/141, 142; 362/298, 301, 302, 303, 304

[56] References Cited

U.S. PATENT DOCUMENTS

| | | | |
|---|---|---|---|
| 1,286,535 | 12/1918 | Cochran | 362/302 |
| 1,827,141 | 10/1931 | Cushing | 372/301 |
| 2,017,716 | 10/1935 | Halvorson | 362/304 |
| 3,634,675 | 1/1972 | Madsen et al. | 362/303 |
| 4,096,555 | 6/1978 | Lasker | 362/302 |
| 4,112,483 | 9/1978 | Small, Jr. et al. | 362/301 X |
| 4,231,080 | 10/1980 | Compton | 362/298 |
| 4,348,750 | 9/1982 | Schwind | 350/294 X |

Primary Examiner—David C. Nelms
Attorney, Agent, or Firm—George W. Field

[57] ABSTRACT

An optical system made up of vertically stacked omnidirectional modules, each having apposed reflectors, one being conical and the other being paraboloidal, and the modules being vertically spaced along an axis so that generally horizontal light from any direction is reflected by the surface in a desired sequence to a light responsive device.

8 Claims, 4 Drawing Figures

OMNIDIRECTIONAL ELECTRO-OPTICAL RECEIVER

TECHNICAL FIELD

This invention relates to the technical fields of optics and civil engineering.

BACKGROUND OF THE INVENTION

It has been found useful in agriculture, construction, road building, and other related fields of civil engineering to create a reference plane of light, usually coherent light from a laser source, in a region where work is to be done. The plane is received by an electro-optical receiver to determine the height of the blade of a bulldozer or ditching machine, for example, to enable precise construction work to be done by relatively unskilled operators.

Prior art receivers for these applications have consisted of rows of photocells directed outwardly at different levels around the surface of a cylinder having a vertical axis, or rows of fiber-optics bundles similarly arranged. These arrangements are provided to avoid the necessity of re-orienting the receiver in azimuth as the direction of movement of a bulldozer changes, for example, and to enable determination of the direction of any vertical movement of the receiver.

Such arrangements are complex and require much assembly labor, and hence are expensive. They also are sensitive to ambient light in a wide vertical acceptance angle, as well as to the light of the referenced plane.

BRIEF SUMMARY OF THE INVENTION

The present invention comprises an omnidirectional electro-optical receiver incorporating a plurality of modules having reflecting surfaces of revolution directing light from a single level of the receiver to a single light responsive member, the modules being stacked, with associated light responsive members, to give a desired number of levels at which the referenced plane may be detected.

Various advantages and features of novelty which characterize the invention are pointed out with particularity in the claims annexed hereto, and forming a part hereof. However, for a better understanding of the invention, its advantages, and objects attained by its use, reference should be had to the drawing which forms a further part hereof, and to the accompanying descriptive matter, in which there are illustrated and described certain preferred embodiments of the invention.

BRIEF DESCRIPTION OF THE DRAWING

In the drawing, in which like reference numerals indicate corresponding parts throughout the several views.

DESCRIPTION OF THE PREFERRED EMBODIMENTS

Figure 1:
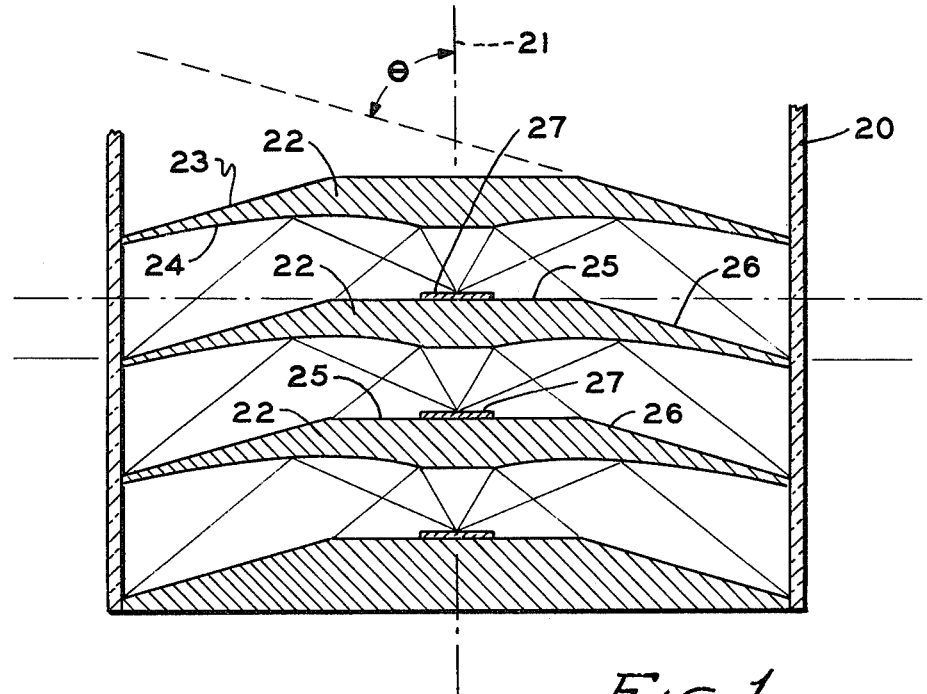
FIG. 1 is a schematic view in section through the vertical axis of an optical system according to the invention.

The embodiment of the invention shown in FIG. 1 comprises a cylindrical housing 20 of transparent material having a vertical axis 21. Mounted in housing 20 in spaced orientation along axis 21 are a plurality of moduli 22 which may be generally identical, each having an upper reflective surface 23 and a lower reflecting surface 24. The modules may be metallic, with specular reflecting surfaces, or may be of plastic with metallized surfaces.

Upper surface 23 is upwardly convex. It includes a central flat portion 25 normal to axis 21, and a peripheral conical portion 26 which may be defined as the surface traced by rotation about axis 21 of a straight line segment oblique to axis 21 at an angle $\theta$. A photocell 27 or other light responsive device is mounted axially on central portion 25.

Figure 2:
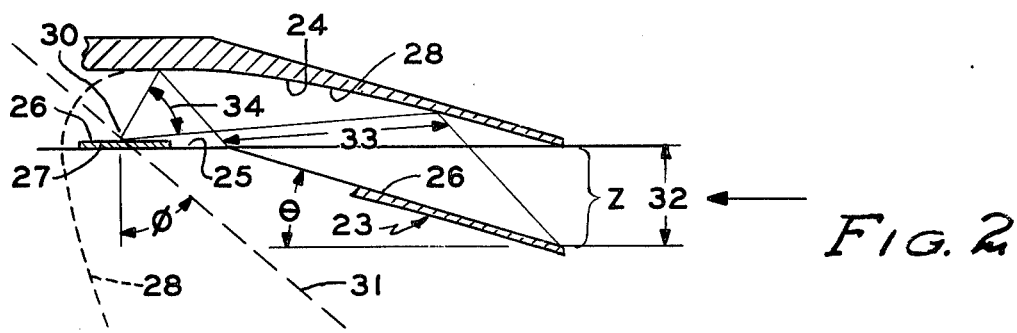
FIG. 2 is a somewhat enlarged schematic partial showing of the reflector arrangement.

Lower surface 24 comprises a downwardly concave surface of revolution about axis 21. As shown in FIG. 2, a parabola 28 has its focus 30 located on the axis of revolution 21 at device 27, and the axis 31 of parabola 28 is oblique with the axis of rotation by an angle $\Phi$. The moduli are spaced along axis 21 by distances Z comparable in magnitude to the degree of desired vertical resolution. Light in a horizontal beam 32 falling on the convex upper surface of one module is reflected to the concave lower surface of the module above it as at 33, and thence is reflected in a converging beam 34 to fall on device 27 and produce an electrical output therefrom.

Figure 3:
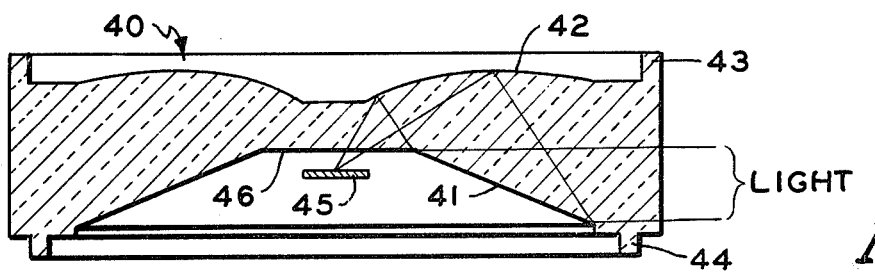
FIG. 3 is a schematic showing of another embodiment of the invention.

In the embodiment of the invention shown in FIGS. 1 and 2, the light from the reference plane is transmitted in air between the reflective surfaces of the module. FIG. 3 shows a different module 40, constructed on transparent material, with a lower conical reflecting surface 41 and an upper reflecting surface 42 in the form of a paraboloid of revolution. The reflecting surfaces are generally the same as those in the first embodiment, but the reflections are internal rather than external. The modules are provided with stacking rings 43 and 44 to enable them to be readily assembled in coaxial relation. Each module is provided with a photocell 45 physically located within the lower reflecting surface, to which light is directed through the flat central portion 46. If desired, the reflective surfaces may be metalized. Light entering the module radially at any point in the circumference is reflected from surface 41 to surface 42, and from thence converges to photocell 45.

Figure 4:
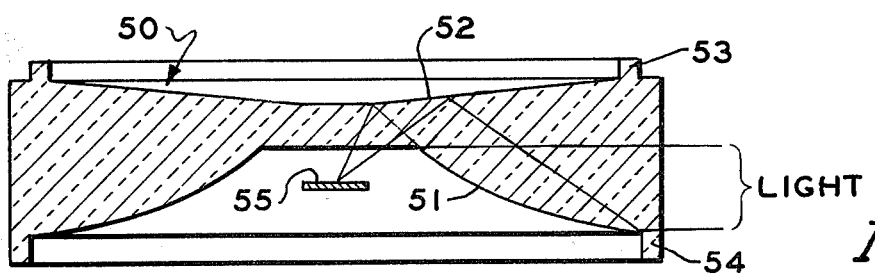
FIG. 4 is a schematic showing of further embodiment of the invention.

FIG. 4 shows a further embodiment of the invention in which a module 50 is again of solid, transparent material. The module has a lower reflecting surface 51 in the form of a surface of revolution, and an upper reflecting surface 52 which is conical; both of these surfaces may be metalized if desired. The modules may be provided with stacking rings 53 and 54. Each module is provided with a photocell 55 physically located within the lower reflecting surface. Light entering module 50 radially at any point in the circumference is reflected convergingly from surface 51 to surface 52, and from thence to photocell 55.

It will be understood that the photocells of the several embodiments are connected to standard electronic circuitry, not shown, by which it is possible to determine what level or levels of the receiver are receiving the light of the reference plane, so that appropriate indicating or controlling functions can be accomplished as desired.

Numerous characteristics and advantages of the invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

I claim:

1. An omnidirectional optical system comprising, in combination:
   a first reflector having a central portion and a convex surface which is a portion of a cone having a first axis;
   a second reflector having a concave surface which is defined by rotation about said first axis of a portion of a parabola having its focus on said first axis and its axis oblique to said first axis;
   means mounting said reflectors in spaced apposition so that light directed therebetween generally perpendicular to said first axis is reflected by said convex surface to said concave surface and by said concave surface to said central portion of said first reflector;
   and a light responsive member mounted on said central portion of said first reflector.

2. An omnidirectional optical system comprising a plurality of reflector modules each symmetrical about a first axis and having a convex surface centrally perpendicular to said axis and peripherally conical about said axis, and an opposite concave surface defined by rotation about said first axis of a portion of a parabola having its focus on said first axis and its axis oblique to said first axis, means mounting said modules in spaced coaxial relation, and light responsive means mounted axially on a central portion of at least one of said convex surfaces.

3. A system according to claim 2 in which the mounting means comprises a hollow transparent body engaging said reflectors about the peripheries thereof.

4. A reflector module according to claim 2 in which the apex angle of the conical surface is about 140 degrees.

5. An optical system comprising first and second reflecting surfaces spaced along an axis of revolution, one of said surface being generated by rotation about said axis of a portion of a parabola having its axis oblique to said axis of revolution, and the other being generated by rotation of a straight line about said axis of revolution, so that light directed generally perpendicularly toward said axis of revolution is reflected by said surfaces to recite on said axis, in which system said reflective surfaces are opposite outer surfaces of a solid body of transparent material.

6. A system according to claim 5 in which at least one of said surfaces is metalized.

7. A system according to claim 5 further including light responsive means mounted at said site on said axis.

8. A system according to claim 5 in which said body is configured for stacking on other like bodies with said axes coincident.

* * * * *